United States Patent
Arnold et al.

(10) Patent No.: US 7,139,127 B2
(45) Date of Patent: Nov. 21, 2006

(54) DIFFRACTIVE OPTICAL ELEMENT

(75) Inventors: Ralf Arnold, Aalen (DE); Bernd Kleemann, Aalen (DE)

(73) Assignee: Carl Zeiss AG (DE)

( * ) Notice: Subject to any disclaimer, the term of this patent is extended or adjusted under 35 U.S.C. 154(b) by 0 days.

(21) Appl. No.: 11/059,803

(22) Filed: Feb. 17, 2005

(65) Prior Publication Data

US 2005/0207012 A1 Sep. 22, 2005

Related U.S. Application Data

(63) Continuation of application No. PCT/EP03/09285, filed on Aug. 21, 2003.

(30) Foreign Application Priority Data

| Aug. 24, 2002 | (DE) | ................................ 102 38 916 |
| Mar. 26, 2003 | (DE) | ................................ 103 13 548 |

(51) Int. Cl.
*G02B 5/18* (2006.01)
(52) U.S. Cl. ..................................... 359/571
(58) Field of Classification Search ................ 359/569, 359/571, 576, 574, 575
See application file for complete search history.

(56) References Cited

U.S. PATENT DOCUMENTS

| 2002/0003661 A1* | 1/2002 | Nakai .......................... 359/569 |
| 2003/0081316 A1 | 5/2003 | Goldberg et al. ............ 359/558 |

FOREIGN PATENT DOCUMENTS

| EP | 0898182 A2 | 2/1999 |
| EP | 0902304 A2 | 3/1999 |
| EP | 0965864 A2 | 12/1999 |
| EP | 1072906 A2 | 1/2001 |
| EP | 1148355 A1 | 10/2001 |
| EP | 1160589 A1 | 12/2001 |

OTHER PUBLICATIONS

"Subwavelength-structred elements" by M. Kuittinen, J. Turunen, and P. Vahimaa from Diffractive Optics for Industrial and Commercial Applications, edited by Jari Turunen and Frank Wyrowski, Berlin, 1999.

(Continued)

*Primary Examiner*—Alessandro Amari
(74) *Attorney, Agent, or Firm*—Young & Basile, P.C.

(57) ABSTRACT

A diffractive optical element contains a multiplicity of binary blazed diffraction structures, which substantially extend mutually parallel in a longitudinal direction. Perpendicularly to the longitudinal direction, the diffraction structures have a width g which is greater than the effective wavelength of electromagnetic radiation for which the diffractive optical element is designed. The diffraction structures respectively comprise a series of individual substructures, which produce a blaze effect and have a maximum extent p in the longitudinal direction which is less than the effective wavelength of the electromagnetic radiation, at least on average over a diffraction structure. In a plan view, the individual substructures respectively have the shape of a closed geometrical surface, which has an extent parallel to the longitudinal direction that varies perpendicularly to the longitudinal direction. Perpendicularly to the longitudinal direction, the surface has a maximum extent which is greater than the effective wavelength.

41 Claims, 9 Drawing Sheets

OTHER PUBLICATIONS

XP002265606"Design of Binary Subwavelength Diffreactive Lenses by Use of Zeroth-Order Effective-Medium Theory," J. Mait, D. Prather, Mirotznik, Journal of The Optical Society of America, vol. 16, No. 5/May 1999/J. Opt. Soc. Am. A,.

XP-000783048, "Blazed binary subwavelength gratings with efficiencies larger than those of conventional é chelette gratings, " Phillippe Lalanne, Lalanne P et al., Optics Letters, Optical Society of America,.

XP-002252424, "Design and fabrication of blazed binary diffractive elements with sampling periods smaller than the structural cutoff," P. Lalanne et al., *Journal of Optical Society of America,* May, 1999.

"Imaging with Blazed-Binary Diffractive elements," Mane-Si Laure Lee, Philippe Lalanne, Pierre Chavel, *laboratoire Charles Fabry de l'Institut d'Optique, Physics, Theory, and Applications of Periodic Structures in Optics.*

"Diffractive lens fabricated with binary features less than 60 nm," by Joseph N. Mait, Axel Scherer , Oliver Dial, Dennis W. Prather and Xiang Gao, *Optics Letter,* Mar. 15, 2000.

"Subwavelength triangular random gratings," by Hiroyuki Ichikawa, Department of Electrical and Electronic Engineering, Ehime University, Japan.

"High-efficiency subwavelength diffractive element patterned in a high-refractive-index material for 633 nm," by Simion Astilean, Philippe Lalanne, Pierre Chavel, Edmond Cambril and H. Launois,, Opt. Lett 23(7), (1998).

"Waveguiding in Blazed-Binary Diffractive Elements," J. Opt. Soc. Am. A-Opt. Image Sci. Vis 16(10) (1999).

"Wide-field-angle behavior of blazed-binary gratings in the resonance domain," by Mane-Si Laure Lee, Philippe Lalanne, and Jean-Claud Rodier, Opt. Lett. 25(23), (2000).

"Blazed-binary diffractive elements with periods much larger than the wavelength," by Mane-Si Laure Lee, Philippe Lalanne, and Pierre Chavel, J. Opt. Soc. Am. A-Opt. Image Sci. Vis 17(7) (2000).

"Fabrication of high-efficiency multilayer-coated binary blazed gratings in the EUV regime," by Patrick P. Naulleau, Erick H. Anderson, Eric M. Gullikson, and Jeffrey Bokor, by Patick Naulleau, Erik H. Anderson, Eric M. Gullikson, Jeffrey Bokor, Optics Communications, Dec. 15, 2001.

Copy of International Search Report dated Jan. 13, 2004.

Copy of International Search Report dated Sep. 11, 2003.

* cited by examiner

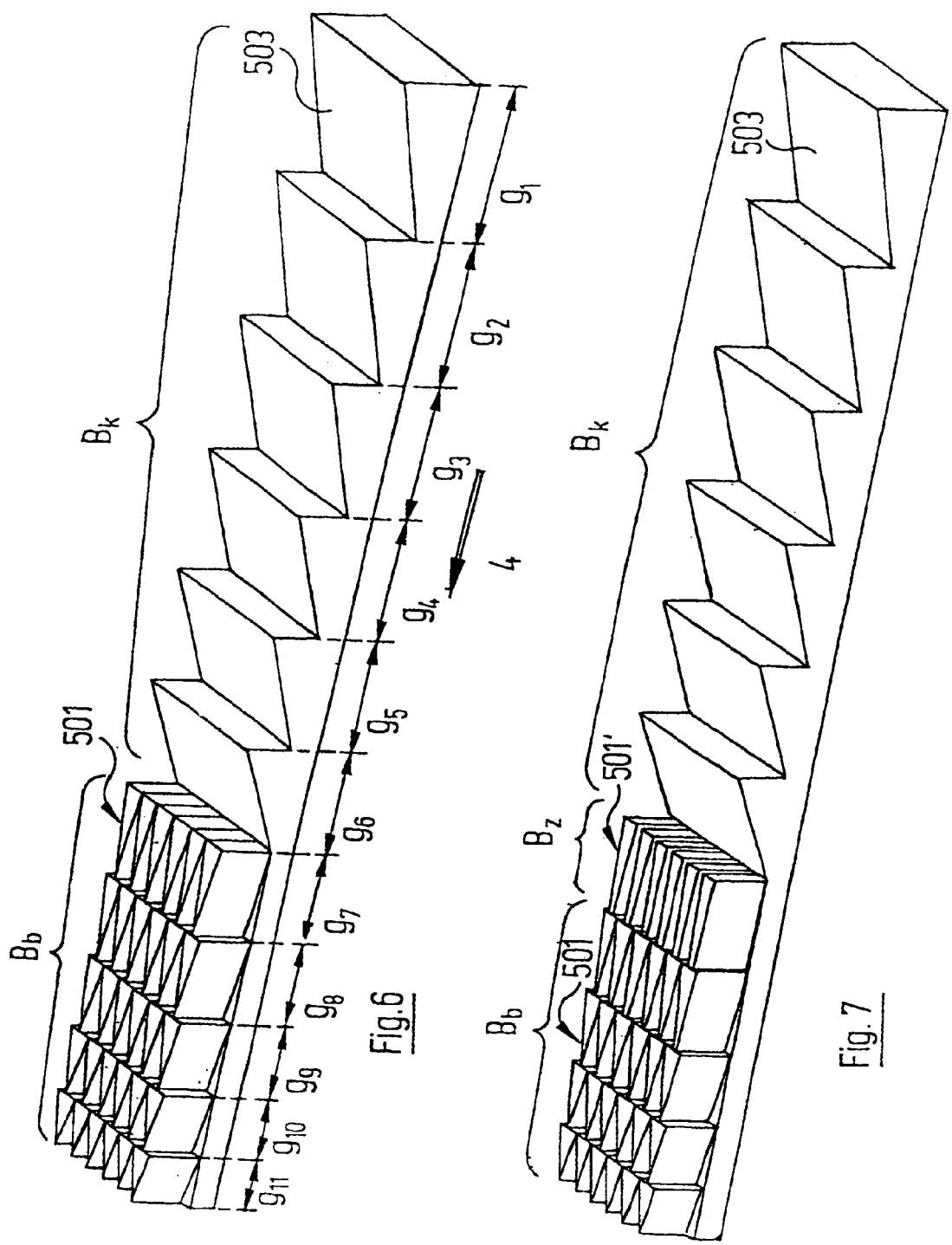

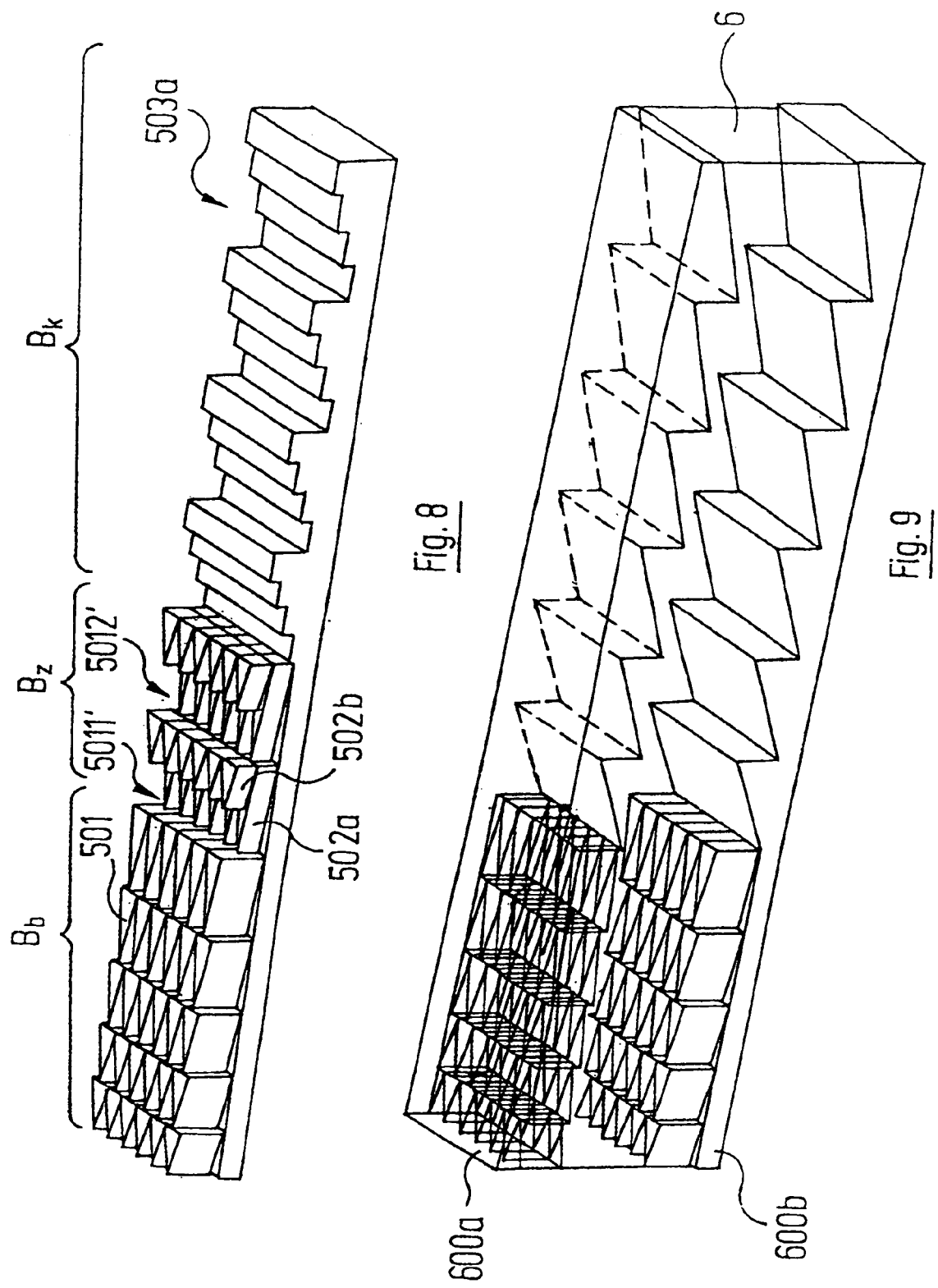

DIFFRACTIVE OPTICAL ELEMENT

BACKGROUND OF THE INVENTION

1. Field of the Invention

The invention relates to a diffractive optical element having a multiplicity of binary blazed diffraction structures. The diffractive optical element is particularly intended for use in microlithographic projection exposure apparatus.

2. Description of the Prior Art

Conventional blazed gratings have diffraction structures of triangular, in particular sawtoothed cross section which extend mutually parallel with a spacing equal to the grating constant g. One edge of the diffraction structures, the blaze edge, has an inclination with respect to the base surface of the grating such that the reflection or refraction law is satisfied for one diffraction order of the incident light, and the majority of the intensity of the diffracted light is therefore contained in the order favoured by the blaze edge. The traditional method of producing such blazed gratings consisted in scratching the diffraction structures in a master grating with the aid of diamonds and making corresponding copies of this master grating. This mechanical method is highly elaborate, on the one hand, and on the other hand it encounters limitations with very short wavelengths of the light for which the grating is intended to be used, since the structures to be produced are too small.

Efforts have therefore been made to employ the process technology used for the production of semiconductor components, in which a substrate is coated with photoresist, exposed, subsequently developed and etched, in order to produce the diffraction structures of blazed gratings. The approach firstly involved using successions of such process cycles to achieve diffraction structures which are supposed to approximate the blaze edge by a stepped edge. If four such steps are used, for example, then diffraction efficiencies of more than 80% can be achieved in the first order. With a further process cycle, eight stages are obtained by which a first-order diffraction efficiency of about 95% can be achieved. In general, $2^n$ steps can be produced by using n process cycles. With increasing n, the stepped profile of the edge becomes closer and closer to the sawtooth profile of ideal blazed gratings in conventional, mechanically produced gratings, the diffraction efficiency of which is 100% in the first order according to scalar theory. The production of such a grating, however, is cost-intensive and error-prone because it is necessary to carry out the process cycle repeatedly.

Attempts have also been undertaken to simulate the blaze profile of the diffraction structures by using binary structures whose dimensions are smaller than the wavelength of the electromagnetic radiation for which the grating was defined. These attempts are based on the fact that light is no longer diffracted at the small substructures, but can only be scattered. This leaves only the zeroth diffraction order which picks up the effect of the substructures merely in the form of a local effective refractive index in phase gratings, or merely in the form of a local shade of grey in amplitude gratings.

A first example of such a binary blazed grating is described in the article by Joseph N. Mait et al. "Diffractive lens fabricated with binary features less than 60 nm", Optics Letters, 15 Mar. 2000, pages 381 et seqq. The substructure used here is a multiplicity of lines, all of which extend parallel to the diffraction structure and whose spacing is less than the effective wavelength.

The article by Philippe Lalanne et al. "Design and fabrication of blazed binary diffractive elements with sampling periods smaller than the structural cut off", J. Opt. Soc. Am. A, May 1999, pages 1143 et seqq. describes blazed diffractive elements of the type mentioned in the introduction, in which the diffraction structures are resolved into individual substructures consisting of rectangular or square pillars. Different "fill factors" can be achieved by varying the pillar width for a predetermined pillar spacing, and this corresponds to a local variation of the effective refractive index. As an alternative, the pillars may also be arranged at different spacings with a constant width.

A common feature of all these attempts to produce binary blazed diffractive optical elements is that the substructures are minutely configured and have a very high aspect ratio (structure height to structure width). They are therefore technologically highly elaborate and expensive to produce, and cannot be made with sufficient accuracy.

SUMMARY OF THE INVENTION

It is an object of the present invention to provide a blazed diffractive optical element of the type mentioned in the introduction, which can be produced with a high resolution in one process cycle.

An optical element according to the invention contains a multiplicity of binary blazed diffraction structures, which substantially extend mutually parallel in a longitudinal direction. Perpendicularly to the longitudinal direction, the diffraction structures have a width g which is greater than the effective wavelength of electromagnetic radiation for which the diffractive optical element is designed. The diffraction structures respectively comprise a series of individual substructures, which produce a blaze effect and have a maximum extent p in the longitudinal direction which is less than the effective wavelength of the electromagnetic radiation, at least on average over a diffraction structure. In a plan view, the individual substructures respectively have the shape of a closed geometrical surface, which has an extent parallel to the longitudinal direction that varies perpendicularly to the longitudinal direction. Perpendicularly to the longitudinal direction, the surface has a maximum extent which is greater than the effective wavelength.

According to the invention, individual substructures with comparatively large closed surfaces are used, and these are exclusively structured laterally. This makes it possible to work about one order of magnitude lower than the aforementioned process technology limits in the prior art. Furthermore, the diffractive optical elements according to the invention can be produced much more quickly and therefore less expensively.

The individual substructures may abut one another directly in the longitudinal direction of the diffraction structures, or they may be spaced apart.

The same applies for the direction perpendicular to the longitudinal direction of the diffraction structures.

It is expedient for the side surface of the individual substructures to have the shape of a polygon figure. By appropriate selection of this polygon figure, the modulation of the effective refractive index or the effective transmission, due to the individual substructures, can be tailored to requirements.

In many cases, a substantially linear modulation of the effective refractive index or the effective transmission is desired, so as to approximate the effect of a conventional blaze edge sloping linearly downwards. In this case, an embodiment of the invention in which the individual substructures at least approximately have the form of a triangle when projected onto the substrate plane is particularly suitable.

In projection onto the substrate plane, the individual substructures may then have the form of an isosceles triangle whose base side approximately has the length p.

An alternative embodiment, which is particularly favourable in terms of production technology, is distinguished in that the individual substructures have the form of a right-angled triangle in projection onto the substrate plane, with the length of a leg corresponding approximately to the dimension p. Of course, the present invention is moreover suitable for the production of optical diffractive elements other than a simple blazed grating. For example, it is possible to achieve the functional behaviour of a sine grating if the individual substructures are respectively bounded by two sine curves, placed symmetrically to each one another, in projection onto the substrate plane.

The production of a polygonal or curved side surface of the diffraction structures with the aid of the known microlithographic methods can be facilitated if it is approximated by a step curve which, for example, corresponds to the increment of the lithographic scriber.

In principle, the lateral side surfaces of the individual substructures need not be composed of flat subsurfaces. For instance, these side surfaces may be formed by one or more ellipse arcs in projection onto the substrate plane. The specific shape of the side surfaces will be determined by the intended local profile of the effective refractive index or the effective transmission.

Besides a region with the aforementioned binary blazed diffraction structures, the optical element may also have another region which contains conventionally blazed diffraction structures having an at least approximately ramped profile. Such a combination of binary and conventionally blazed diffraction structures in an optical element is preferable, in particular, when the different diffraction efficiencies of the binary and conventionally blazed diffraction structures are intended to be utilised. Whereas a controlled local modification of the diffraction efficiency in the case of purely conventionally blazed diffraction structures is only possible by detuning, i.e. by reducing the inherently possible diffraction efficiency, a local increase in the diffraction efficiency can also be achieved by the use of binary blazed diffraction structures. The diffraction efficiency, integrated over the entire surface of the optical element, can thereby be increased compared with elements having purely conventionally blazed diffraction structures.

In an advantageous refinement of this configuration, the conventionally blazed diffraction structures have a grating constant which differs from the width g of the binary diffraction structures perpendicularly to their longitudinal direction. If the grating constant of the conventionally blazed diffraction structures is less than the width g of the binary diffraction structures, for example, then the difference in the respective diffraction efficiencies is particularly large since the diffraction efficiency of conventionally blazed diffraction structures decreases significantly towards very small grating constants. In most diffractive optical elements having a locally varying grating constant, however, the diffraction efficiency should remain approximately constant. It is then more favourable for the conventionally blazed diffraction structures to have a grating constant which is greater than the width g of the binary diffraction structures perpendicularly to their longitudinal direction. Those regions of the diffractive optical element with a small grating constant are therefore binary-blazed, and thus have a higher diffraction efficiency compared with corresponding conventionally blazed diffraction structures.

If abrupt and therefore undesirable changes in the diffraction efficiency due to the higher diffraction efficiency of the binary blazed regions occur at the junction with conventionally blazed diffraction structures, then a continuous transition of the diffraction efficiency can be achieved if an intermediate region with at least one binary blazed diffraction structure, which is designed so that the diffraction efficiency in the intermediate region is reduced in relation to that of an optimal design, is arranged between the one region with binary blazed diffraction structures and the other region with conventionally blazed diffraction structures. This design may, in particular, be configured so that the diffraction efficiency in the intermediate region lies between that of the one region with binary blazed diffraction structures and that of the other region with conventionally blazed diffraction structures. Such a reduction of the diffraction efficiency in the intermediate region can be achieved by controlled local detuning of the diffraction efficiency in the intermediate region, for example by deviating from the inherently optimal dimensions of the individual substructures of which the diffraction structures are made up. In the event of fairly large intermediate regions, for example, the detuning may be carried out in such a way as to achieve a quasi-continuous transition between the diffraction efficiencies of the neighbouring regions with conventionally and binary blazed diffraction structures, respectively.

The diffractive optical element according to the invention may be configured either as a phase-modulating element or as an amplitude-modulating element. In the former case, the diffraction structures consist of transmissive material with a refractive index $n_1$ and have a height h, which satisfy the equation $$(n_1-n_2)h=\lambda_v,$$

where $\lambda_v$ is the vacuum wavelength of the electromagnetic radiation for which the diffractive optical element is designed, and $n_2$ is the refractive index of the medium which surrounds the individual substructures. The individual substructures may be raised on the surface of the diffractive optical element, for example as the result of an etching process. The medium surrounding the individual substructures could then be the gas, for example air, in which the diffractive optical element is used, or a vacuum or even an immersion liquid.

The individual substructures may, however, also be embedded in the diffractive optical element, and have a refractive index $n_1$ which differs from the refractive index $n_2$ of the laterally surrounding material. The two refractive indices $n_1$ and $n_2$ may furthermore differ from the refractive index of the underlying substrate, as well as from the medium lying on top.

Such individual substructures may, for example, be produced by bombarding a suitable substrate with ion beams through a photolithographically produced mask. These ion beams may modify the refractive index of the substrate material by doping, i.e. by introducing extrinsic atoms, or by depletion, i.e. by ejecting intrinsic atoms of the substrate.

The diffraction structures of the diffractive optical element may also be arranged above one another in a direction perpendicular to the geometrical surfaces of the individual substructures. A multilayer structure is achieved in this way, and it is not imperative whether the individual layers are flat or curved surfaces. Such multilayer optical elements offer further opportunities for locally adjusting the diffractive effect of the element very accurately. The multilayer structure affects, in particular, the dependency of the element on the polarisation, the angle of incidence as well as the wavelength of the incident light.

The multilayer structure may, on the one hand, be obtained by applying the diffraction structures in direct succession. If, as described above, the diffraction structures are raised on the surface of the diffractive optical element by means of an etching process, for example, then two diffraction structures applied in direct succession may be produced by a two-stage etching process. It is, however, also possible to apply the diffraction structures of the different layers on different supports which are arranged above one another, preferably mutually parallel, and mutually separated. There are then no restrictions in terms of the geometry and alignment of stacked diffraction structures, as is the case when they are applied directly to one another.

If the phase-modulating optical element is intended for particularly short-wave light then a compensating layer, the material and thickness of which are selected so that an absorption effect of the phase-modulating optical element is at least approximately homogeneous over its plane, is preferably arranged between the diffraction structures. Without such a compensating layer, the absorptivity of the optical element would be spatially inhomogeneous since at very short wavelengths, for instance in the soft X-ray light range, there are no available phase-retarding materials whose absorptivity is negligible.

If the compensating layer consists of a material which has an absorptivity greater than an absorptivity of the material of which the diffraction structures consist, and whose phase-retarding effect is less than that of this material, then the compensating layer can be made thinner than the diffraction structures.

In the case of an amplitude-modulating optical element, the individual substructures are formed by a coating whose transmission is negligible, in particular less than 1%.

If the amplitude-modulating optical element is intended for particularly short-wave light, then similarly as in the case of the phase-modulating optical elements, a compensating layer whose material and thickness are selected so that the phase-retarding effect of the amplitude-modulating optical element is at least approximately homogeneous over its surface, is here again preferably arranged between the diffraction structures. Without such a compensating layer, the effect on the phase of transmitted electromagnetic radiation would be spatially inhomogeneous since at very short wavelengths, for instance in the soft X-ray light range, there are no available absorbent materials whose retarding effect is negligible.

If the compensating layer consists of a material which has a phase-retarding effect greater than that of the material of which the diffraction structures consist, and whose absorptivity is less than that of this material, then the compensating layer can be made thinner than the diffraction structures.

If the width (g) and the orientation of the diffraction structures vary over the surface of the optical element, then the effect of a lens can be replicated. The optical elements according to the invention are also suitable, in particular, as lenses in an objective.

In a preferred exemplary embodiment of the invention, the maximum dimensions p in the longitudinal direction of at least two individual substructures within a diffraction structure are unequal. This is because it has been found that the diffraction effect of the optical element can actually be improved by this breaking of the strict periodicity, since it avoids so-called stitching or alignment defects which may occur in strictly periodic arrangements of very small structures and can lead to undesirable scattered light.

Preferably, the dimensions p are randomly distributed. For randomly distributed dimensions of sub-wavelength structures of antireflection gratings, it is shown in an article by H. Ichikawa, Journal of Modern Optics, 2202, Vol. 49, No 11, pages 1893–1906, that the random distribution impairs the reflectivity almost insignificantly. However, the signal-to-noise ratio is instead reduced at the cost of the transmission, and even if individual sub-wavelength structures are larger than is actually compatible with the diffraction condition. This effect can also be utilised for the diffraction structures according to the invention.

The random distribution may, for example, be a Gaussian distribution whose central value should be less than the maximum structure size dictated by the diffraction condition. The dimensions p may, however, also be equidistributed within an interval which contains this maximum structure size dictated by the diffraction condition. Within such an interval, moreover, there may be any other distributions of the dimensions p.

In this context, it is particularly preferable for the maximum dimensions p of the individual substructures within a diffraction structure, in the longitudinal direction, to satisfy the condition $$0.8 \cdot \lambda < p < 1.2 \cdot \lambda$$

where $\lambda$ is the effective wavelength of the electromagnetic radiation for which the diffractive optical element is intended and which strikes the optical element perpendicularly.

BRIEF DESCRIPTION OF THE DRAWINGS

Preferred exemplary embodiments of the invention will be explained in more detail below with reference to the drawings, in which:

FIG. 6 shows in perspective a detail of a phase grating, which has a region with conventionally blazed diffraction structures and a region with binary blazed diffraction structures;

FIG. 7 shows a similar phase grating as in FIG. 6, but having an intermediate region between the regions with conventionally and binary blazed diffraction structures;

FIG. 8 shows another exemplary embodiment of a phase grating having an intermediate region between the regions with conventionally and binary blazed diffraction structures;

FIG. 9 shows in perspective a detail of a diffractive optical element which consists of two phase gratings according to FIG. 6 arranged above each other;

DESCRIPTION OF PREFERRED EXEMPLARY EMBODIMENTS

Figure 1:
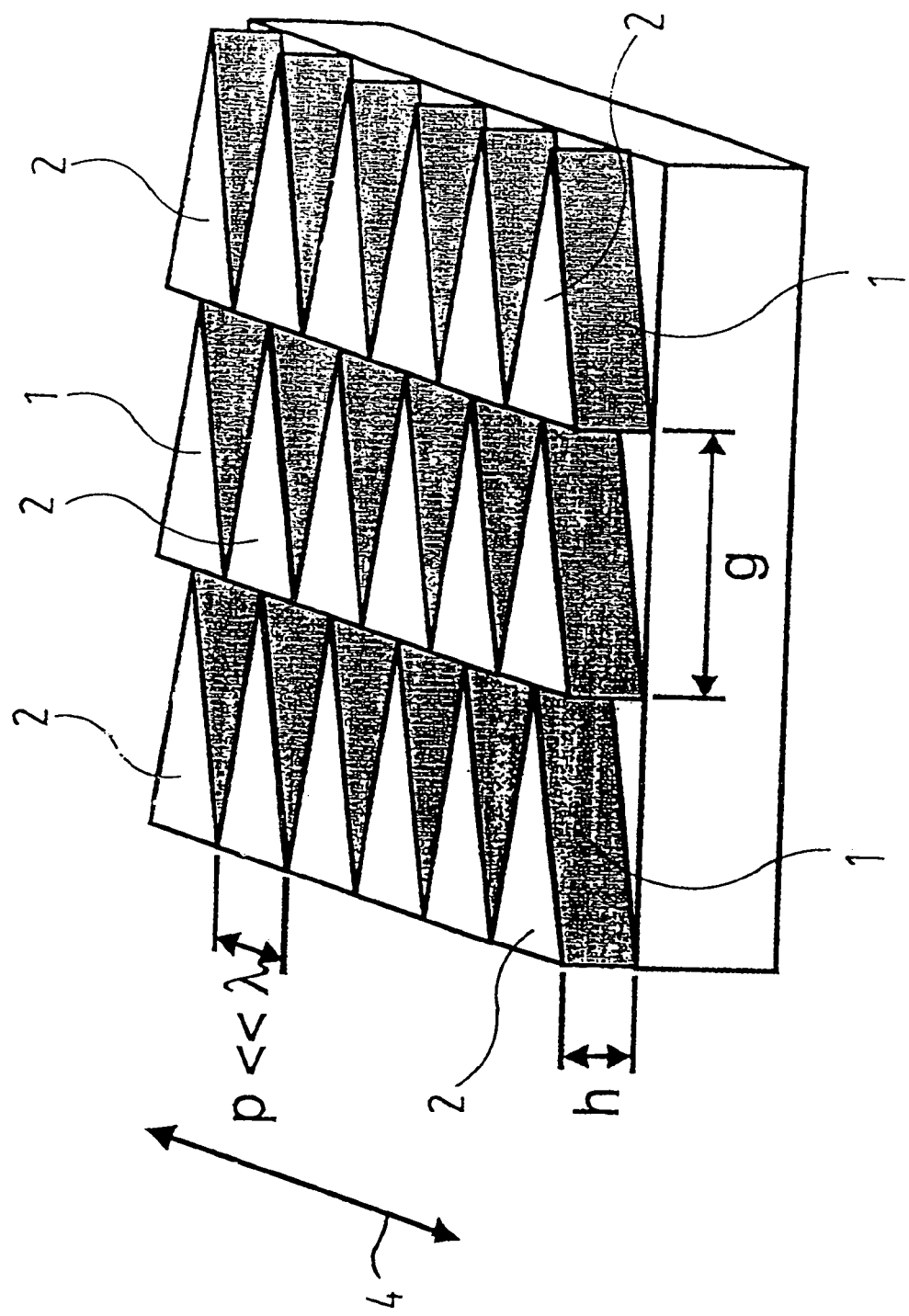
FIG. 1 shows a detail of a binary blazed phase grating in perspective.

The blazed phase grating represented in FIG. 1 consists of a transmissive material with a refractive index $n_1$. On the surface pointing upwards, it bears a multiplicity of parallel diffraction structures 1 extending in a straight line, three of which are shown as details in the drawing. The diffraction structures 1 have a width g perpendicular to their longitudinal direction. Since the diffraction structures 1 are directly next to one another, their width g corresponds to the conventional grating constant. In order to be able to achieve diffraction effects, the size of g is greater than the effective wavelength $\lambda$ of the electromagnetic radiation for which the phase grating is intended, in the material with the refractive index $n_1$. The effective wavelength $\lambda$ is in this case given by $$\lambda = \lambda_v / n_1,$$

where $\lambda_v$ is the wavelength in a vacuum.

Every diffraction structure 1 is in turn made up of a multiplicity of individual substructures 2 placed directly next to one another, each of which has the form of a very tall equilateral triangle. The base sides of the individual substructures 2 have a length p which is less than the effective wavelength of the electromagnetic radiation being used, for example less than half of this wavelength. The base sides of the individual substructures 2 are directly next to one another; the apices of the triangles which form the individual substructures 2 touch the base sides of the individual substructures 2 of the neighbouring diffraction structure 1. This gives rise to diffraction structures which are bounded on one side, at the left in FIG. 1, by a plane vertical surface and on the other side, at the right in FIG. 1, by sawtoothed lateral structure.

The height h of the individual substructures 2 is dictated by the requirement for a full-wave phase retardation by the individual substructures 2:

$$(n_1 - n_2)h = \lambda_v.$$

In this equation, $\lambda_v$ is the vacuum wavelength of the electromagnetic radiation being used and $n_2$ is the refractive index of the medium which surrounds the individual substructures 2. With the raised construction of the individual substructures 2 as represented, $n_2$ is for example the refractive index of air.

The structure of a phase grating represented in FIG. 1 is produced by process technologies such as those known from the semiconductor industry. A flat starting substrate of the intended material is in this case coated with a photoresist and then exposed with a commercially available mask scriber. This is followed by development of the exposed photoresist and an etching process, in which the individual diffraction structures 1 are created.

Figure 2:
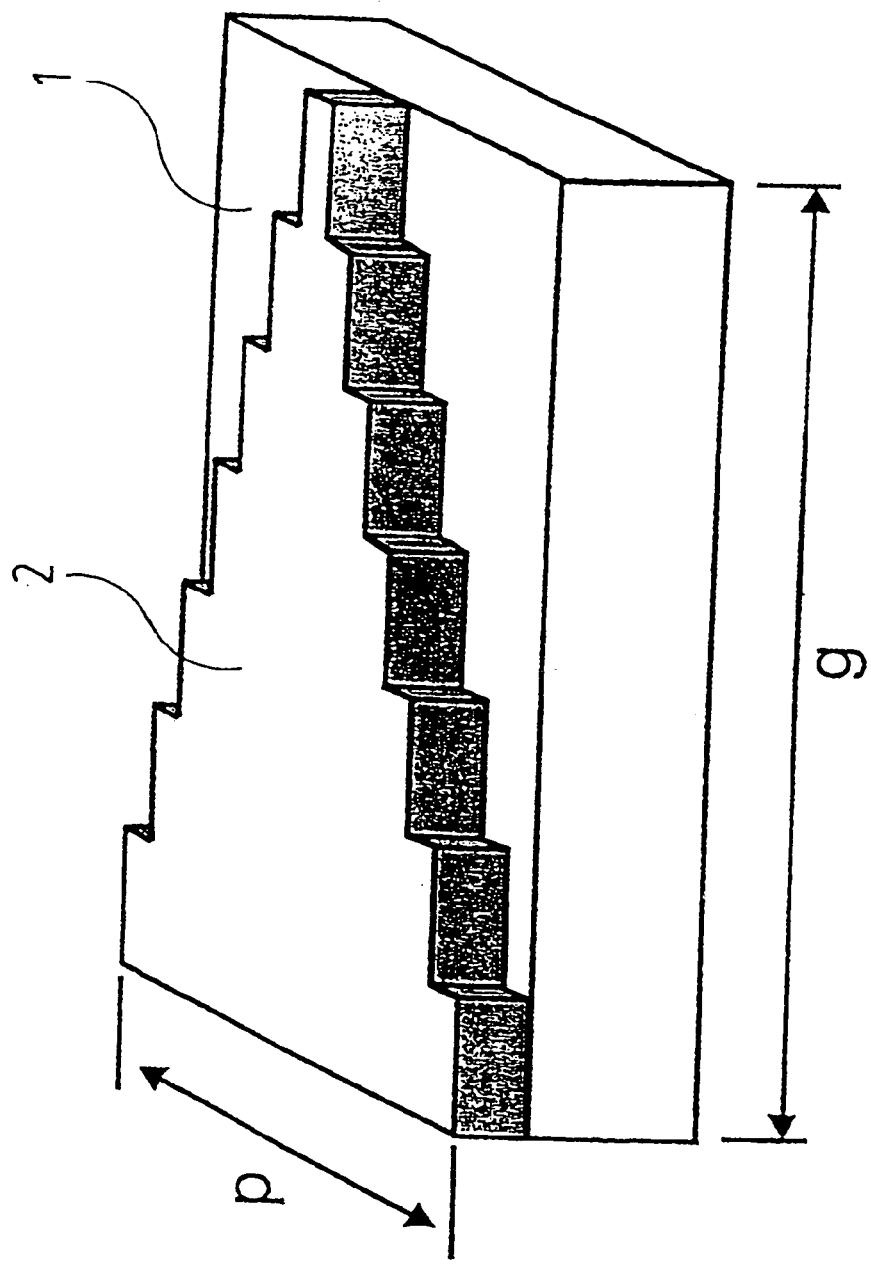
FIG. 2 shows an individual substructure of the phase grating in FIG. 1, on an enlarged scale and also in perspective.

In practice, the sides of the individual substructures 2 schematically represented in FIG. 1 are approximated by step curves, as can be seen in FIG. 2. With the best mask scribers currently available, the scribing accuracy is in the range from 5 to 10 nanometres. With a wavelength in the visible spectral range, in view of the constraint that the size p should be less than the effective wavelength $\lambda$, it is feasible to scribe the individual structures in FIG. 2 with ten or more scanning stages. A diffraction efficiency of more than 80% can be achieved in this way.

Figures 3A, 3B:
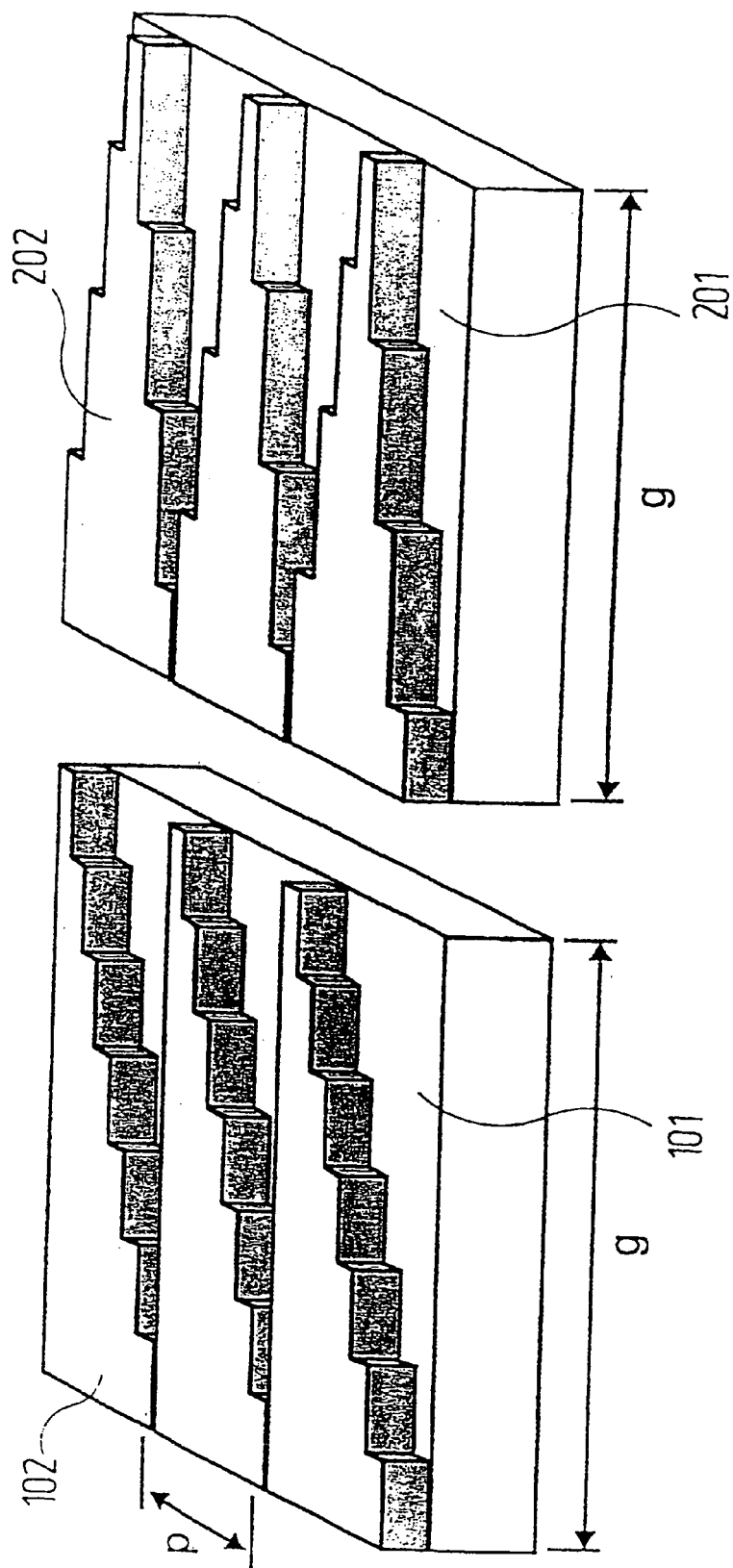
FIGS. 3a and 3b show views of phase gratings similar to FIG. 1, but with modified individual substructures.

FIG. 3a shows a blazed phase grating with individual substructures 102 whose shape can be regarded as a right-angled triangle. The shorter legs of these individual substructures 102 are aligned and follow the direction of the diffraction structure 101, whereas the longer legs have the length of the grating constant g. The hypotenuses of the individual substructures 102 are again approximated by a step curve.

The individual substructures 202 of the phase grating represented in FIG. 3b are again founded on the basic shape of an isosceles triangle, the lateral sides of these triangles once more being approximated by step curves. The step curves of the two lateral sides are not, however, symmetrical with respect to the mid-plane of the individual substructures 202 but, with an equal step height, mutually offset by one half of the step height.

The asymmetric configuration of the individual substructures 102 and 202 in FIGS. 3a and 3b has the advantage that, for a given width p of the individual substructures 102 or 202 and with a given resolution of the mask scriber, it is possible to double the number of stages in the direction of the grating constant g.

In the phase gratings explained above with reference to FIGS. 1 to 3b, the diffraction structures 1, 101 and 201 were respectively bounded on one side by a flat vertical face and on the other side by a periodically structured, likewise vertical face. The diffraction structures 1, 101 and 201 do not therefore have any symmetry with respect to their longitudinal direction. The situation is different in the exemplary embodiment of a phase grating represented in FIG. 4. This has diffraction structures 301 which are made up of mirror-symmetrical individual substructures 302. The width p of these individual substructures 302 in the longitudinal direction of the diffraction structure 301 is again less than the effective wavelength of the electromagnetic radiation with which the phase grating is intended to interact. The overall width of the individual substructures 302 in the direction perpendicular thereto once more corresponds to the grating constant g and has a size which corresponds at least to the effective wavelength of the electromagnetic radiation being used.

The individual substructures 302 may respectively be regarded as bounded in the longitudinal direction of the diffraction structures 301 by two sine curves. The sine curves are in turn approximated by step curves. In the exemplary embodiment of FIG. 4, they are incremented symmetrically with respect to a mid-plane of the individual substructures 302, which extends perpendicularly to the longitudinal direction of the diffraction structures 30. To this extent, the exemplary embodiment of FIG. 4 corresponds to that of FIG. 2. An asymmetric configuration would also be possible in analogy with FIG. 3b.

Figure 4:
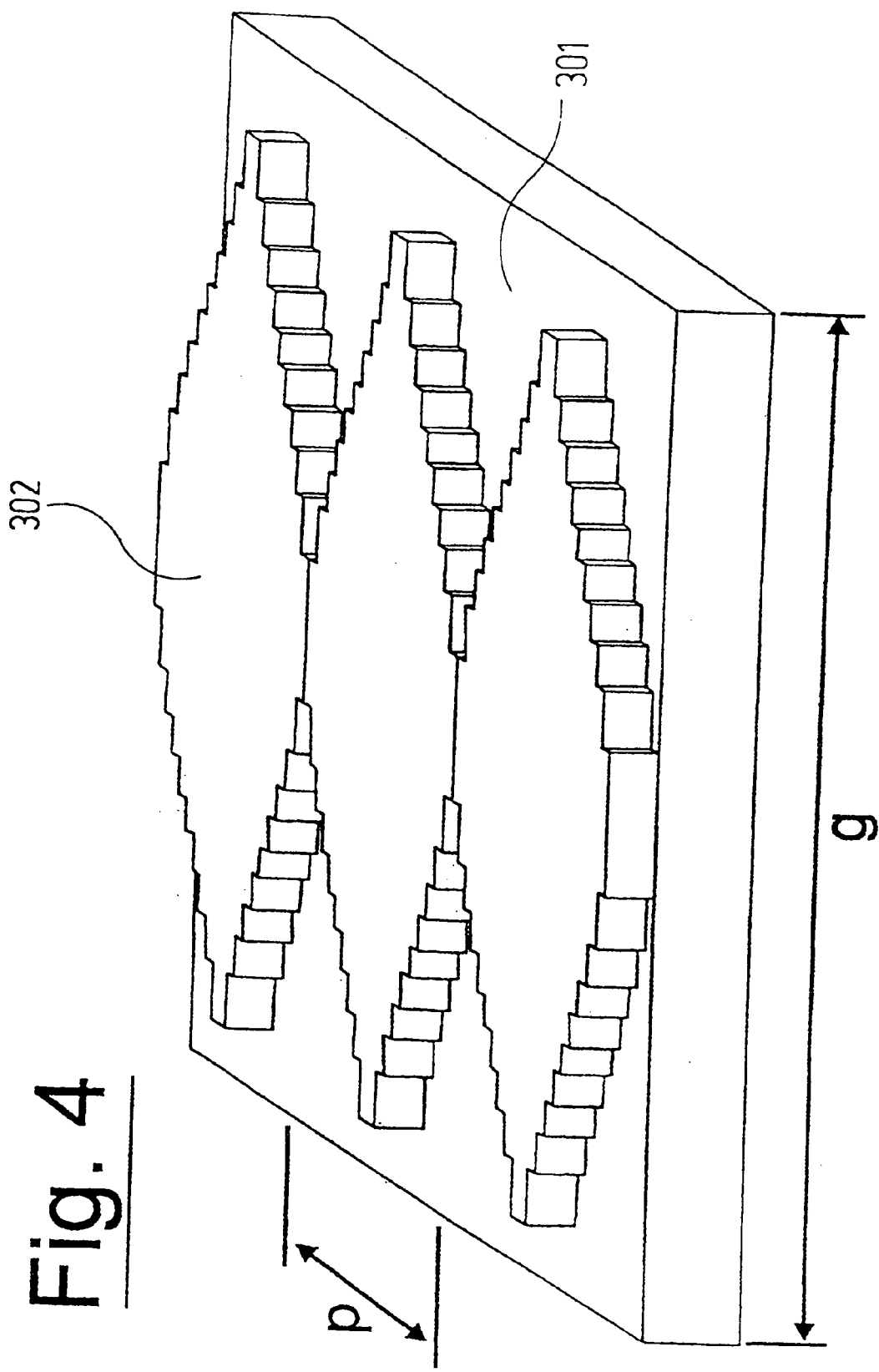
FIG. 4 shows a detail of a sine phase grating in perspective.

The phase grating represented in FIG. 4 has the properties of a sine grating. It is distinguished in that its diffraction structures 301 are bounded on opposite sides by mutually contiguous geometrical surfaces, which have the periodicity p in the longitudinal direction of the diffraction structures 301. The "width" of the individual substructures 302 is in this case modulated sinusoidally in the longitudinal direction of the diffraction structures and incremented according to the mask scriber resolution.

The exemplary embodiment of FIG. 4 furthermore makes it clear that the term "blazed" as used above does not mean that the full intensity of the transmitted electromagnetic radiation must appear in a single diffraction order. Rather, it more generally covers all cases in which a particular intensity distribution over the various diffraction orders is sought.

Figure 5:
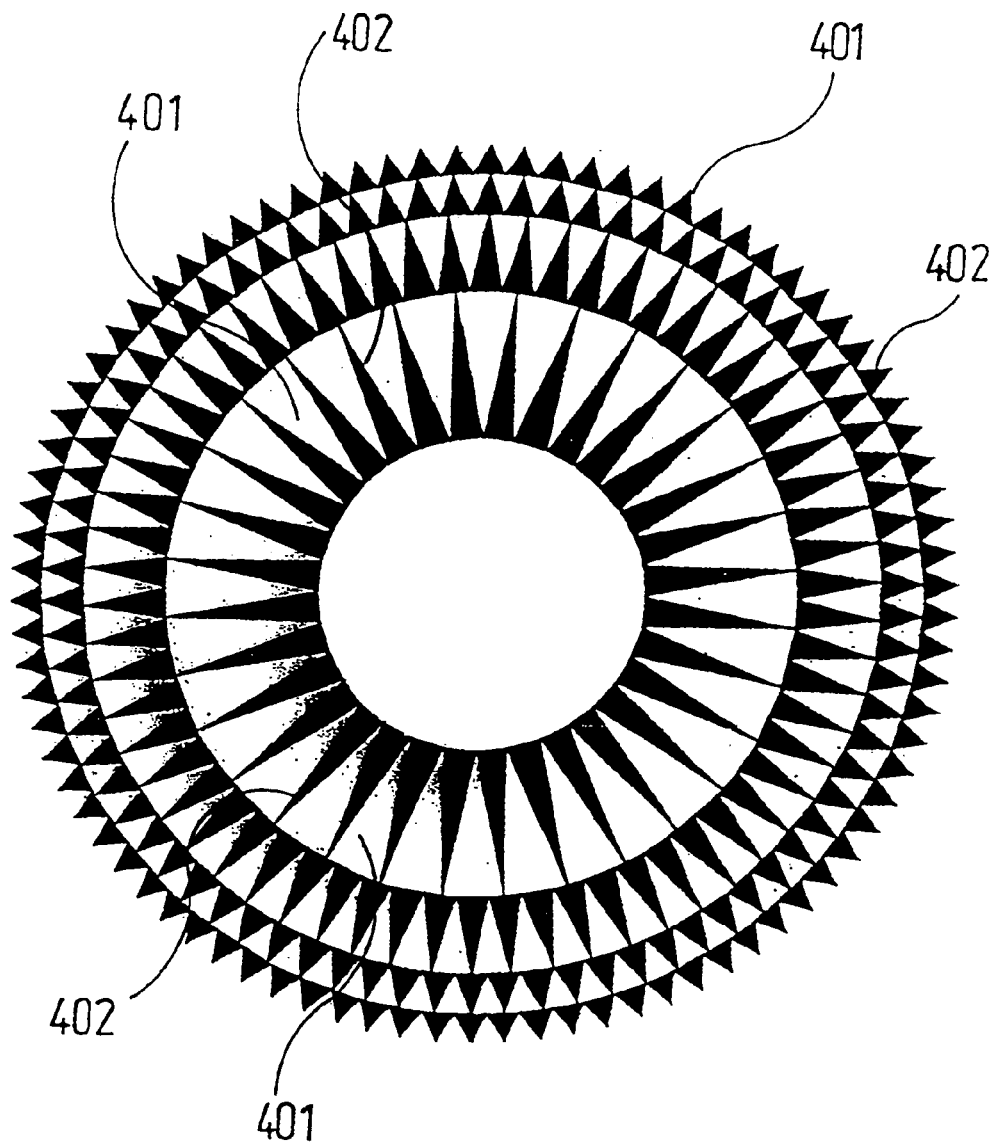
FIG. 5 shows a schematic plan view of a Fresnel zone plate.

FIG. 5 represents an exemplary embodiment of a diffractive optical element which, unlike the exemplary embodiments of FIGS. 1 to 4, is not a grating but a Fresnel zone plate. In this case, the diffraction structures 401 are arranged annularly around a mid-point. Similarly as in the exemplary embodiment of FIG. 1, the individual substructures 402 again have the shape of tall isosceles triangles whose base sides are placed next to one another. This time, however, the base sides of these individual substructures 402 do not lie on straight lines but on concentric circles.

FIG. 6 shows in perspective representation a detail of a diffractive optical element which is a phase grating with a grating constant varying locally. The phase grating has a region $B_k$ with conventionally blazed diffraction structures 503, i.e. ones which are ramped in profile. The grating constants $g_j$ of these conventionally blazed diffraction structures 503 decrease continuously, i.e. from diffraction structure to diffraction structure, in the direction denoted by 4 so that $g_1 > g_2 > g_3 > g_4 > g_5 > g_6$.

The element has another region $B_b$ with binary diffraction structures 501, which are designed as shown in FIG. 1. The width $g_j$ of the diffraction structures 501, which corresponds to the grating constant of conventional diffraction structures, likewise decreases in the direction denoted by 4 in this region $B_b$ so that $g_7 > g_8 > g_9 > g_{10} > g_{11}$.

Since the structure widths $g_j$ of the diffraction structures 501 in the binary blazed region $B_b$ are furthermore less than the grating constants $g_i$ in the conventionally blazed grating region $B_k$, a grating constant is thereby obtained which varies continuously over the range of the diffractive optical element as shown in detail in FIG. 6. The effect observed in purely conventionally blazed elements, namely that the diffraction efficiency decreases significantly in regions with a small grating constant, does not however occur here since the conventional diffraction structures in these regions are replaced by the binary blazed diffraction structures 501, which have a higher diffraction efficiency than comparable conventional diffraction structures.

Owing to this higher diffraction efficiency of the binary blazed diffraction structures 501, however, an abrupt change in the diffraction efficiency may occur at the junction between the conventionally blazed region $B_k$ and the binary blazed region $B_b$. If such an abrupt change in the diffraction efficiency is undesirable, then an intermediate region with binary blazed diffraction structures, in which the diffraction efficiency is "artificially" lowered by detuning the diffraction structures, may be provided between these regions.

An example of this is shown in FIG. 7. The diffractive optical element shown there corresponds substantially to that in FIG. 6 but in this case, as mentioned above, an intermediate region $B_z$, in which the diffraction structures 501' are detuned, is provided between the conventionally blazed region Bk and the binary blazed region $B_b$. In the intermediate region $B_z$, the diffraction efficiency is therefore less than in the corresponding region in FIG. 6 with the grating constant $g_7$. On the other hand, the diffraction efficiency in this intermediate region $B_z$ is greater than in the neighbouring region $B_k$ with conventionally blazed diffraction structures 503. The diffraction efficiency in the intermediate region $B_z$ therefore lies between the diffraction efficiencies of the neighbouring regions, so that a more uniform transition is achieved between the diffraction efficiencies. In the ideal case, a diffraction-efficiency transition can be achieved without discontinuity by appropriate detuning of the binary blazed diffraction structures 501' in the intermediate region $B_z$.

FIG. 8 shows in perspective a detail of another phase grating whose function corresponds substantially to that of the phase grating shown in FIG. 7. The conventionally blazed diffraction structures 503a in this case have a ramp profile which is approximated by a step curve. The intermediate region $B_z$ in this exemplary embodiment furthermore comprises two diffraction structures 5011' and 5012', which comprise individual substructures 502a and 502b respectively arranged above one another in two planes. In each plane, the individual substructures 502a and 502b are constructed as shown in FIG. 1. Individual substructures 502a and 502b applied directly to one another in this way can be produced by means of a two-stage etching and lithography process. The effect of the diffraction structures 5011' and 5012' designed as two layers in the intermediate region $B_z$ substantially corresponds to that of diffraction structures as described in EP 1 160 589 A1. Illustratively speaking, the diffraction structures 5011' and 5012' designed as two layers may be regarded as a combination of binary blazed and conventionally blazed diffraction structures. The extra degree of freedom obtained by each height stage then makes it possible to adjust the diffraction efficiency of the diffraction structures more accurately.

FIG. 9 shows another diffractive optical element, in which two of the phase gratings shown in FIG. 6 face each other. The intermediate space between the two sub-elements 600a and 600b is filled with an optically transparent material 6, for example a polymer. As regards the conventionally blazed regions, the diffractive optical element to this extent has a structure as described in EP 0 902 304 A2. In order to produce such a diffractive optical element, the lower sub-element 600b may first be produced conventionally in a lithographically defined etching process. The optically transparent material 6 is subsequently applied and super-polished. A second layer is then applied to the material 6 and is in turn lithographically structured. Crosstalk of the structuring tools for structuring the upper sub-element 600a should be avoided by suitable choice of the process control.

Crosstalk can also be prevented by vapour-depositing a stop layer, for example a very thin metal layer, between the two sub-elements 600a and 600b.

In the aforementioned diffractive elements, the phase-shifting effect of the individual substructures was based on the longer path which the electromagnetic radiation has to cover owing to the individual substructures raised on the surface of the optical element. The phase retardation may, however, also be achieved with individual substructures embedded in the material of the optical element, if their refractive index is modified in relation to that of the surrounding material. This can be done by bombarding a suitable substrate with ion beams through a photolithographically produced mask. The effect of the ion beams may be to introduce extraneous atoms into the substrate, i.e. doping. As an alternative, the structure may also be produced by ejecting atoms from a previously doped substrate, i.e. by producing depletion zones. Both of these change the refractive index.

In the preceding description, it was assumed that phase-modulating diffractive optical elements were respectively involved, the blazed effect being based on a controlled variation of the effective refractive index of the diffraction structures in a direction perpendicular to their longitudinal direction. In principle, however, the inventive concept can also be applied to amplitude-modulating diffractive optical elements. FIGS. 1 to 7 can in this case be interpreted such that the diffraction structures 1, 101, 201, 301, 401, 501 etched from the substrate is replaced by a layer with a negligible transmissivity. Such layers can be produced by commercially available photolithographic mask methods. For example, chromium layers with a thickness of from 80 nm to 100 nm may be used.

In diffractive optical elements which are intended to be exposed to very short-wave light in the soft X-ray range i.e. wavelengths $\lambda$ of the order of a few nanometres, however, neither materials which are purely phase-retarding but without significantly absorbing, nor materials which absorb but do not significantly affect the phase of the light are available. If one of the aforementioned phase gratings were to be operated with such short wavelengths, then this would mean that the effects of a phase grating are undesirably superimposed with that of an amplitude grating. The absorption by the phase grating would then vary locally. The same applies equally for amplitude gratings.

Figure 10:
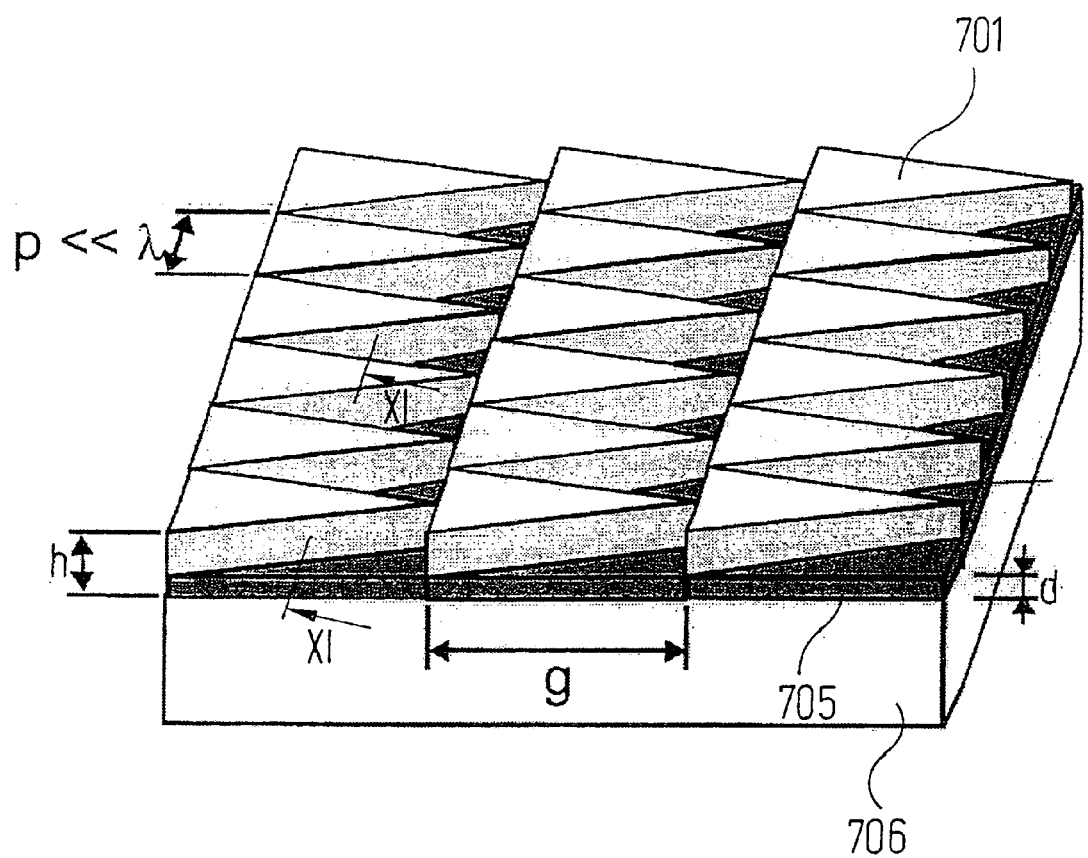
FIG. 10 shows in perspective a detail of another exemplary embodiment of a binary blazed phase grating, which has a compensating layer between the diffraction structures.
Figure 11:
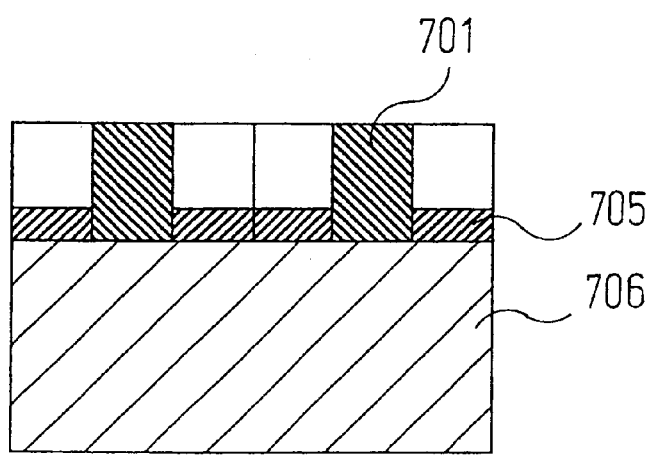
FIG. 11 shows a partial section through the phase grating shown in FIG. 10, in an enlarged representation.

FIGS. 10 and 11 show, respectively in a perspective representation similar to FIG. 1 and an enlarged partial section along the line XI—XI, a detail of a phase grating in which the absorption is constant over the entire extent of the phase grating. To this end, alongside diffraction structures 701 which are designed like the diffraction structures 1 shown in FIG. 1, the phase grating has a flat compensating layer 705 of constant thickness interrupted by the diffraction structures 701. The materials for the diffraction structures 701 and the compensating layer 705, as well as their thicknesses h and d respectively, are selected so that the thinner compensating layer 705 has the same absorption effect as the thicker diffraction structures 701. Since the compensating layer 705 has an—albeit small—phase-retarding effect in addition to the absorbing effect, this must be taken into account when designing the thickness h of the diffraction structures 701 so that the phase difference has the desired magnitude of $2\pi$. Furthermore, the choice of the thicknesses h and d should of course be made so that the absorption effect is not only uniform but also as small as possible.

Examples of calculating the thicknesses h and d for materials with different complex refractive indices $n_1$, $n_3$ with $n_j=\delta_j+i\beta_j$, j=1, 3 ($n_2$ is already given as the refractive index of the surrounding medium, for example air) can be found in US 2003/0081316 A, which describes a similar multilayer structure for per se known binary or stepped phase gratings that are intended for use at extremely short wavelengths. The content of US 2003/0081316 A is therefore fully incorporated into the disclosure of this application.

It should be understood that the thicknesses h and d are respectively halved when using the phase grating in double transmission, for example by employing a reflective substrate 706.

A thin membrane as proposed in US 2003/0081316 A, for example, may be used as the substrate 706 on which the diffraction structures 701 and the compensating layer 705 are applied. In order to produce the phase grating, a material of refractive index $n_1=\delta_1+i\beta_1$ which is predominantly phase-retarding ($|\beta_1|\ll1$) is applied to the substrate 706. The structuring of the material is carried out photolithographically in a manner known per se. After the photolithographically defined regions which surround the diffraction structures 701 have been etched away, a second material is applied with a height d, this material of refractive index $n_3=\delta_3+i\beta_3$ being predominantly absorbent ($|\delta_3|\ll1$). That part of the material which lies on the photoresist covering the diffraction structures 701 is removed with it in a lift-off process. The phase grating shown in FIGS. 10 and 11 then remains.

In a similar way to this, it is also possible to produce amplitude gratings whose effect on the phase of very short-wave transmitted light is substantially homogeneous locally. The roles of the two aforementioned materials should be interchanged for this. Specifically, this means that the diffraction structures 701 now consist of a predominantly absorbent material, whereas the compensating layer 705 consists of a predominantly phase-retarding material.

Figure 12:
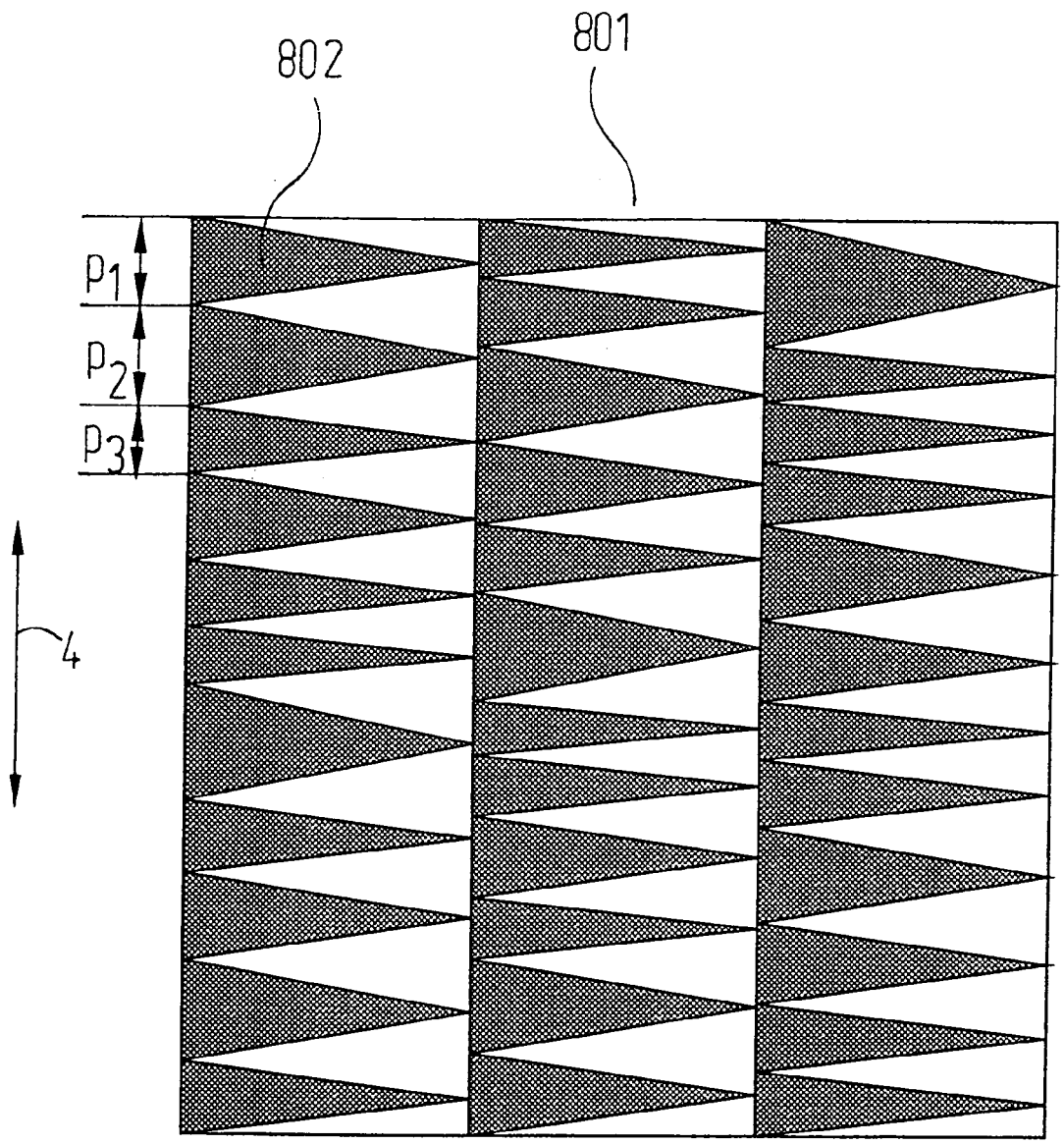
FIG. 12 shows a schematic plan view of another example of a phase grating with randomly distributed dimensions of the individual substructures in the longitudinal direction of the diffraction structures.

FIG. 12 shows a plan view of another exemplary embodiment of a phase grating, in which the maximum dimensions $p_i$ of the individual substructures 802 in the longitudinal direction, indicated by a double arrow 4, are randomly distributed within a diffraction structure 801. In the exemplary embodiment represented, it is to be assumed that light with an effective wavelength $\lambda$ arrives perpendicularly on the phase grating whose diffraction structures 801 have a refractive index $n_1$. The maximum dimensions $p_i$ of the individual substructures 802 in the longitudinal direction 4 then satisfy the condition $$0.8\cdot\lambda<p_i<1.2\cdot\lambda.$$

This means that some of these dimensions $p_i$ are actually greater than the effective wavelength $\lambda$. Nevertheless, light passing through the phase grating will not be diffracted into more than one diffraction order since the dimensions $p_i$ are still on average slightly less than the effective wavelength $\lambda$.

The phase grating shown in FIG. 12 is simpler to produce since the dimensions pi are meant to fluctuate statistically and sometimes even extend beyond the effective wavelength $\lambda$.

The statistical fluctuations also have the advantage that they avoid so-called stitching or alignment defects, which may occur in periodic arrangements of very small structures and can lead to undesirable scattered light.

The invention claimed is:

1. A diffractive optical element having a multiplicity of binary blazed diffraction structures, which
   substantially extend mutually parallel in a longitudinal direction,
   have a width g perpendicularly to the longitudinal direction which is greater than an effective wavelength of electromagnetic radiation, for which the diffractive optical element is designed, and which
   respectively comprise a series of individual substructures, which
      produce a blaze effect,
      have a maximum extent p in the longitudinal direction which is less than the effective wavelength, at least on average over a diffraction structure, and
      which respectively have the shape of a closed geometrical surface in a plan view, wherein the surface
         has an extent parallel to the longitudinal direction that varies perpendicularly to the longitudinal direction, and
         has a maximum extent perpendicularly to the longitudinal direction which is greater than the effective wavelength.

2. The optical element according to claim 1, wherein the individual substructures directly adjoin one another in the longitudinal direction.

3. The optical element according to claim 1, wherein the individual substructures are spaced apart in the longitudinal direction of the diffraction structures.

4. The optical element according to claim 1, wherein the individual substructures directly adjoin one another perpendicularly to the longitudinal direction.

5. The optical element according to claim 1, wherein the individual substructures are spaced apart perpendicularly to the longitudinal direction.

6. The optical element according to claim 1, wherein the individual substructures have a side surface which has the shape of a polygon figure.

7. The optical element according to claim 6, wherein a polygonal side surface of the individual substructures is approximated by a step curve.

8. The optical element according to claim 6, wherein the individual substructures at least approximately have the form of a triangle when projected onto a substrate plane of the optical element.

9. The optical element according to claim 6, wherein the triangle is an isosceles triangle having a base side whose length is equal to p.

10. The optical element according to claim 6, wherein the triangle is a right-angled triangle having a leg whose length is equal to p.

11. The optical element according to claim 1, wherein the individual substructures are geometrically bounded by two mutually symmetrical sine curves.

12. The optical element according to claim 11, wherein a curved side surface of the individual substructures is approximated by a step curve.

13. The optical element according to claim 1, wherein the individual substructures are geometrically bounded by at least one ellipse arc in projection onto a substrate plane of the optical element.

14. The optical element according to claim 1, having a first region with binary blazed diffraction structures and a second region with conventionally blazed diffraction structures, which have an at least approximately ramped profile.

15. The optical element according to claim 14, wherein the conventionally blazed diffraction structures have a grating constant which differs from the width g of the binary blazed diffraction structures.

16. The optical element according to claim 15, wherein the conventionally blazed diffraction structures have a grating constant which is greater than the width g of the binary blazed diffraction structures.

17. The optical element according to claim 14, wherein an intermediate region with at least one binary blazed diffraction structure, which is designed so that the diffraction efficiency in the intermediate region is reduced in relation to that of an optimal design, is arranged between the first region and the second region.

18. The optical element according to claim 17, wherein the diffraction efficiency in the intermediate region lies between that of the first region and that of the second region.

19. The optical element according to claim 1, which is designed as a phase-modulating optical element.

20. The optical element according to claim 19, wherein the individual substructures are raised on an upper side of the diffractive optical element.

21. The optical element according to claim 19, wherein the individual substructures are embedded in the diffractive optical element, and have a refractive index $n_1$ which differs from a refractive index $n_2$ of a laterally surrounding material.

22. The optical element according to claim 21, wherein the individual substructures are doping zones in the material.

23. The optical element according to claim 21, wherein the individual substructures are depletion zones in the material.

24. The optical element according to claim 20, wherein the diffraction structures are applied directly on one another in a direction perpendicular to the surface of the individual substructures.

25. The optical element according to claim 20, wherein the diffraction structures are applied on different supports, which are arranged above one another and mutually separated.

26. The optical element according to claim 20, wherein the supports are arranged mutually parallel.

27. The optical element according to claim 20, wherein a compensating layer, the material and thickness of which are selected so that an absorption effect of the phase-modulating optical element is at least approximately homogeneous over a substrate plane of the optical element, is arranged between the diffraction structures.

28. The optical element according to claim 27, wherein the compensating layer consists of a material with an absorptivity which is greater than an absorptivity of the material of which the diffraction structures consist.

29. The optical element according to claim 27, wherein the compensating layer consists of a material with a phase-retarding effect which is less than a phase-retarding effect of the material of which the diffraction structures consist.

30. The optical element according to claim 20, wherein the individual substructures consist of transmissive material with a refractive index $n_1$ and have a height h according to the equation $$(n_1-n_2)h=\lambda_v,$$

where $\lambda_v$ is the vacuum wavelength of the electromagnetic radiation and $n_2$ is the refractive index of the medium which surrounds the individual substructures.

31. The optical element according to claim 1, wherein the diffraction structures are arranged above one another in a direction perpendicular to the surface of the individual substructures.

32. The optical element according to claim 1, which is designed as an amplitude-modulating optical element, wherein the individual substructures are formed by a coating or doping whose transmission is negligible.

33. The optical element according to claim 32, wherein the transmission is less than 1%.

34. The optical element according to claim 33, wherein a compensating layer of a material with a thickness d is arranged between the diffraction structures, the material and the thickness d being selected so that a phase-retarding effect of the amplitude-modulating optical element is at least approximately homogeneous over a substrate plane of the optical element.

35. The optical element according to claim 34, wherein the compensating layer consists of a material with an absorptivity which is less than an absorptivity of the material of which the diffraction structures consist.

36. The optical element according to claim 32, wherein the compensating layer consists of a material with a phase-retarding effect which is greater than a phase-retarding effect of the material of which the diffraction structures consist.

37. The optical element according to claim 1, wherein the width g and the orientation of the diffraction structures vary over a substrate plane of the optical element, so that the effect of a lens is replicated.

38. The optical element according to claim 1, wherein the maximum extents p of at least two individual substructures within a diffraction structure are unequal.

39. The optical element according to claim 38, wherein the maximum extents p of the individual substructures within a diffraction structure are randomly distributed.

40. The optical element according to claim 38, wherein the maximum extents p of the individual substructures within a diffraction structure satisfy the condition $0.8 \cdot \lambda < p < 1.2 \cdot \lambda$ where $\lambda$ is the effective wavelength of the electromagnetic radiation which strikes the optical element perpendicularly.

41. Objective of a microlithographic projection exposure apparatus, comprising at least one optical element according to claim 1.

* * * * *